US012736592B2

(12) United States Patent
Takeda et al.

(10) Patent No.: US 12,736,592 B2
(45) Date of Patent: Sep. 15, 2026

(54) BATTERY ABNORMALITY DETECTION SYSTEM, BATTERY ABNORMALITY DETECTION METHOD, AND BATTERY ABNORMALITY DETECTION PROGRAM

(71) Applicant: Panasonic Intellectual Property Management Co., Ltd., Osaka (JP)

(72) Inventors: Mutsuhiko Takeda, Kyoto (JP); Shinya Nishikawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 175 days.

(21) Appl. No.: 18/725,861

(22) PCT Filed: Jan. 6, 2023

(86) PCT No.: PCT/JP2023/000113

§ 371 (c)(1),
(2) Date: Jul. 1, 2024

(87) PCT Pub. No.: WO2023/136202

PCT Pub. Date: Jul. 20, 2023

(65) Prior Publication Data

US 2025/0076403 A1 Mar. 6, 2025

(30) Foreign Application Priority Data

Jan. 12, 2022 (JP) ................................ 2022-002945

(51) Int. Cl.
*G01R 31/396* (2019.01)
*G01R 31/3842* (2019.01)
(Continued)

(52) U.S. Cl.
CPC ....... *G01R 31/396* (2019.01); *G01R 31/3842* (2019.01); *G01R 31/52* (2020.01);
(Continued)

(58) Field of Classification Search
CPC .. G01R 31/396; G01R 31/3842; G01R 31/52; G01R 31/378; H01M 4/5825;
(Continued)

(56) References Cited

U.S. PATENT DOCUMENTS

2010/0188054 A1 7/2010 Asakura et al.
2011/0012604 A1 1/2011 Tsujiko et al.
(Continued)

FOREIGN PATENT DOCUMENTS

CN 109663756 A * 4/2019 ............ H01M 10/44
JP 2009-032506 2/2009
(Continued)

OTHER PUBLICATIONS

International Search Report of PCT application No. PCT/JP2023/000113 dated Mar. 14, 2023.
(Continued)

*Primary Examiner* — Son T Le
(74) *Attorney, Agent, or Firm* — RIMON P.C.

(57) ABSTRACT

A data acquirer acquires voltage data and current data of a plurality of cells in a battery pack including the plurality of cells connected in series, or voltage data and current data of a plurality of parallel cell blocks in a battery pack including the plurality of parallel cell blocks each including a plurality of cells connected in parallel. Based on the voltage data and the current data of each of the cells or each of the parallel cell blocks, a dV/dQ estimator estimates dV/dQ indicating a differential value of the voltage with respect to the capacity of each of the cells or each of the parallel cell blocks. A determiner determines whether or not a micro-short circuit has occurred in the battery pack based on a change in variation of characteristic points of dV/dQ between the plurality of cells or the plurality of parallel cell blocks.

5 Claims, 6 Drawing Sheets

(51) Int. Cl.

| | |
|---|---|
| ***G01R 31/52*** | (2020.01) |
| ***H01M 4/58*** | (2010.01) |
| ***H01M 10/0525*** | (2010.01) |
| ***H01M 10/42*** | (2006.01) |
| ***H01M 10/48*** | (2006.01) |
| *B60L 3/00* | (2019.01) |

(52) U.S. Cl.

CPC ..... *H01M 4/5825* (2013.01); *H01M 10/0525* (2013.01); *H01M 10/4285* (2013.01); *H01M 10/482* (2013.01); *B60L 3/0046* (2013.01); *B60L 3/0069* (2013.01); *H01M 2220/20* (2013.01)

(58) Field of Classification Search

CPC ......... H01M 10/0525; H01M 10/4285; H01M 10/482; H01M 2220/20; B60L 3/0046; B60L 3/0069; H02J 7/663; H02J 7/62; H02J 7/82; Y02E 60/10

See application file for complete search history.

(56) References Cited

U.S. PATENT DOCUMENTS

| | | | |
|---|---|---|---|
| 2012/0169288 | A1 | 7/2012 | Ueki et al. |
| 2020/0091554 | A1 | 3/2020 | Matsuoka et al. |

FOREIGN PATENT DOCUMENTS

| | | |
|---|---|---|
| JP | 2009-252381 | 10/2009 |
| JP | 2019-169446 | 10/2019 |
| JP | 2020-071054 | 5/2020 |
| WO | 2018/169029 | 9/2018 |

OTHER PUBLICATIONS

The EPC Office Action dated Apr. 17, 2025 for the related European Patent Application No. 23740211.0.

* cited by examiner

OCV[V]
4.1
3.9
3.7
3.5
3.3
3.1
2.9
2.7
2.5
2.3
Phase transition
LFP
0
20
40
60
80
100
SOC[%]

BATTERY ABNORMALITY DETECTION SYSTEM, BATTERY ABNORMALITY DETECTION METHOD, AND BATTERY ABNORMALITY DETECTION PROGRAM

CROSS-REFERENCE TO RELATED APPLICATIONS

This application is a U.S. national stage application of the PCT International Application No. PCT/JP2023/000113 filed on Jan. 6, 2023, which claims the benefit of foreign priority of Japanese patent application No. 2022-002945 filed on Jan. 12, 2022, the contents all of which are incorporated herein by reference.

TECHNICAL FIELD

The present disclosure relates to a battery abnormality detection system, a battery abnormality detection method, and a battery abnormality detection program, for detecting micro-short circuiting inside a battery.

BACKGROUND ART

In recent years, lithium-ion iron phosphate (LFP) batteries have been used increasingly as batteries for EVs. For the lithium-ion iron phosphate batteries, as well as for ternary lithium-ion batteries, it is required to detect a micro-short circuit at an early stage when the micro-short circuit occurs inside a cell.

One technique of detecting an internal micro-short circuit that has been proposed is a technique of statistically processing amounts of voltage change per unit time during constant-current charging to detect an internal micro-short circuit (for example, see PTL 1). This method determines internal micro-short circuits from the rate of voltage change. However, because the lithium-ion iron phosphate batteries shows a SOC (State of Charge)-OCV (Open Circuit Voltage) curve with a large plateau region, it is difficult to detect a micro-short circuit from a difference in SOC even when some difference in SOC arises from the micro-short circuit. The reason is that the voltage change with respect to the SOC change is significantly small in the plateau region of SOC-OCV curve.

Another technique of detecting an internal micro-short circuit that has been proposed is a technique of detecting an internal micro-short circuit from the amount of voltage change when a battery is left in a SOC region in which the amount of voltage change is large (for example, see PTL 2). This technique makes it possible to check the amount of voltage change even with lithium-ion iron phosphate batteries by leaving the battery in a specific SOC at which the amount of voltage change is large. However, in actual use in the market, it is rare that batteries are left for a long time at a specific SOC, so the technique is not suitable for consumer uses although it is suitable for such uses as testing.

CITATION LIST

Patent Literature

PTL 1: Japanese Patent Unexamined Publication No. 2020-71054

PTL 2: Japanese Patent Unexamined Publication No. 2019-169446

SUMMARY

The present disclosure has been made in view of the foregoing and other problems, and it is an object of the disclosure to provide a highly versatile technique of detecting a micro-short circuit in a battery that has a SOC-OCV characteristic with a large plateau region.

In order to solve the foregoing and other problems, a battery abnormality detection system according to an aspect of the present disclosure includes: a data acquirer acquiring voltage data and current data of a plurality of cells in a battery pack including the plurality of cells connected in series, or voltage data and current data of a plurality of parallel cell blocks in a battery pack including the plurality of parallel cell blocks each including a plurality of cells connected in parallel; a dV/dQ estimator estimating dV/dQ indicating a differential value of a voltage with respect to a capacity of each of the cells or each of the parallel cell blocks, based on the voltage data and the current data of the each of the cells or the each of the parallel cell blocks; and a determiner determining whether or not a micro-short circuit has occurred in the battery pack based on a change in variation of characteristic points of dV/dQ between the plurality of cells or the plurality of parallel cell blocks.

It should be understood that any combinations of the above-described components, and any embodiments of the present disclosure implemented in various devices, systems, methods, and computer programs also equally effective aspects of the present disclosure.

According to the present disclosure, it is possible to provide a highly versatile technique of detecting a micro-short circuit in a battery that has a SOC-OCV characteristic with a large plateau region.

BRIEF DESCRIPTION OF THE DRAWINGS

FIG. 3 is a view illustrating an example of the configuration of a battery abnormality detection system according to an exemplary embodiment.

DESCRIPTION OF EMBODIMENTS

Figure 1:
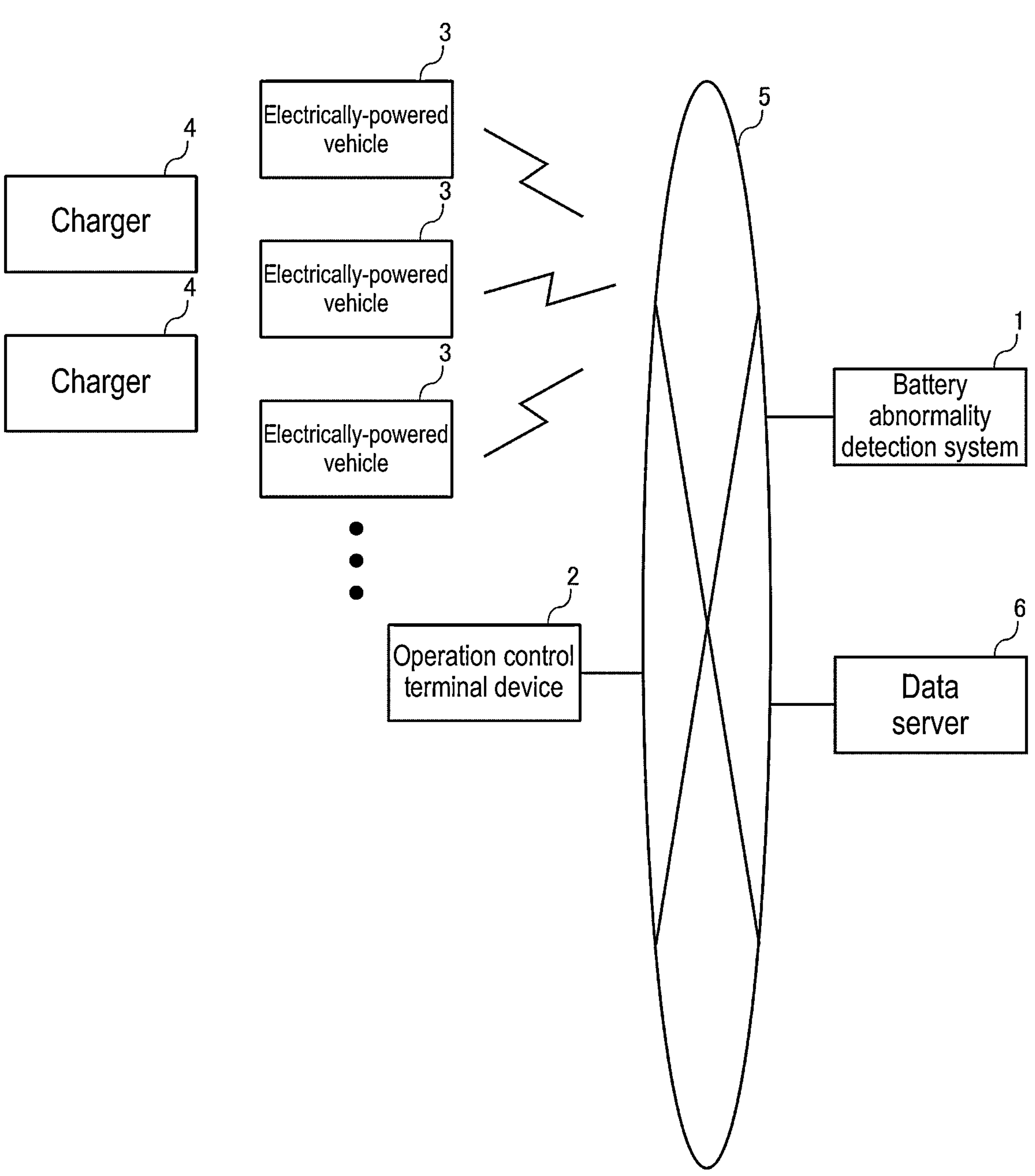
FIG. 1 is a view for illustrating a battery abnormality detection system according to an exemplary embodiment.

FIG. 1 is a view for illustrating battery abnormality detection system 1 according to an exemplary embodiment.

Battery abnormality detection system 1 according to the exemplary embodiment is a system that is used by at least one delivery operator. Battery abnormality detection system 1 may be configured on, for example, an on-premise server installed in an on-premise facility or a data center of a business operator that provides a battery status analysis service of battery pack 41 (see FIG. 2) mounted in electrically-powered vehicle 3. Alternatively, battery abnormality detection system 1 may be configured on a cloud server that is used based on a cloud service. Alternatively, battery abnormality detection system 1 may be configured on a plurality of servers that are distributed at a plurality of locations (data centers or on-premise facilities). The plurality of servers may be any of combinations of a plurality of on-premise servers, combinations of a plurality of cloud servers, and combinations of on-premise servers and cloud servers.

Network 5 is a general term for communication channels, such as the Internet, dedicated line, and VPN (Virtual Private Network), irrespective of their communication media or protcols. Examples of usable communication media include mobile telephone network (cellular network), wireless LAN, wired LAN, optical fiber network, ADSL network, CATV network, and the like. Examples of the usable communication protocols include TCP (Transmission Control Protocol)/IP (Internet Protocol), UDP (User Datagram Protocol)/IP, Ethernet (registered trademark), and the like.

A delivery operator possesses a plurality of electrically-powered vehicles 3 and a plurality of chargers 4, and utilizes the plurality of electrically-powered vehicles 3 for delivery operation. Note that electrically-powered vehicles 3 may be charged from chargers other than chargers 4 that are installed at delivery bases. The delivery operator owns delivery bases for parking electrically-powered vehicles 3. At each delivery base, operation control terminal device 2 is installed. Operation control terminal device 2 may be implemented, for example, by a PC. Operation control terminal device 2 may be used for managing a plurality of electrically-powered vehicles 3 belonging to the delivery base.

Operation control terminal device 2 can access battery abnormality detection system 1 via network 5 to utilize the status analysis service for battery pack 41 mounted in electrically-powered vehicle 3. While electrically-powered vehicle 3 is parked at a delivery base, vehicle controller 30 of electrically-powered vehicle 3 and operation control terminal device 2 are able to exchange data via network 5 (such as wireless LAN), CAN cable, and the like. While electrically-powered vehicle 3 is travelling, vehicle controller 30 and operation control terminal device 2 may be configured to be able to exchange data via network 5.

Data server 6 acquires battery data from operation control terminal device 2 or electrically-powered vehicle 3, and accumulates the data. Data server 6 may be an on-premise server installed in a data center or an on-premise facility of the delivery operator or may also be a cloud server that is used by the delivery operator or the battery status analysis service provider. It is also possible that each of the delivery operator and the battery status analysis service provider may have a respective data server 6.

Figure 2:
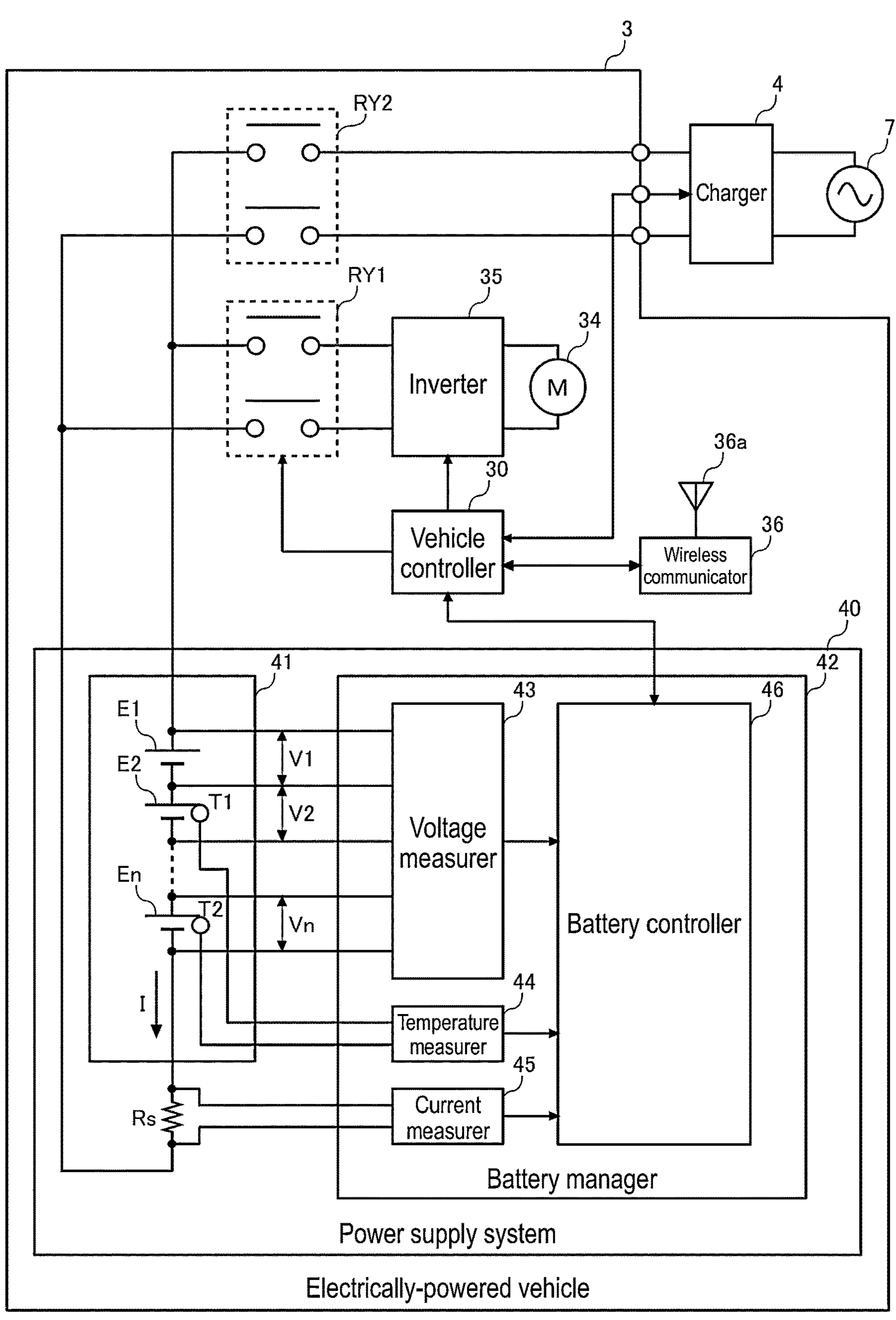
FIG. 2 is a view illustrating a detailed configuration of a power supply system mounted in an electrically-powered vehicle.

FIG. 2 is a view illustrating a detailed configuration of power supply system 40 mounted in electrically-powered vehicle 3. Power supply system 40 is connected to motor 34 via first relay RY1 and inverter 35. During motoring operation, inverter 35 converts direct-current power supplied from power supply system 40 into alternating-current power and supplies the alternating-current power to motor 34. During regeneration, inverter 35 converts alternating-current power supplied from motor 34 into direct-current power and supplies the direct-current power to power supply system 40. Motor 34 is a three-phase AC motor, which rotates in response to the alternating-current power supplied from inverter 35 during motoring operation. During regeneration, motor 34 converts rotational energy produced by deceleration into alternating-current power and supplies the alternating-current power to inverter 35.

Vehicle controller 30 is a vehicle ECU (Electronic Control Unit) for controlling the entirety of electrically-powered vehicle 3 and may be composed of an integrated-type VCM (Vehicle Control Module), for example. Wireless communicator 36 includes a modem and performs wireless signal processing for wirelessly connecting to network 5 via antenna 36*a*. For the wireless communication network to which electrically-powered vehicle 3 can be wirelessly connected, it is possible to use mobile telephone network (cellular network), wireless LAN, V2I (Vehicle-to-Infrastructure), V2V (Vehicle-to-Vehicle), ETC system (Electronic Toll Collection System), and DSRC (Dedicated Short Range Communications), for example.

First relay RY1 is a contactor inserted between wiring lines connecting power supply system 40 and inverter 35. When travelling, vehicle controller 30 controls first relay RY1 to turn to an on state (closed state) to electrically connect power supply system 40 and a drive system of electrically-powered vehicle 3 to each other. When not travelling, vehicle controller 30 controls first relay RY1 to turn to an off state (open state) to electrically cut off power supply system 40 from the drive system of electrically-powered vehicle 3. Note that it is possible to use other types of switches, such as semiconductor switches, in place of the relay.

By connecting to charger 4, electrically-powered vehicle 3 allows battery pack 41 inside power supply system 40 to be charged from outside. Charger 4 is connected to commercial power utility grid 7 to charge battery pack 41 of electrically-powered vehicle 3. In electrically-powered vehicle 3, second relay RY2 is inserted between wiring lines connecting power supply system 40 and charger 4 to each other. Note that it is possible to use other types of switches, such as semiconductor switches, in place of the relay. Battery manager 42 controls second relay RY2 to turn to the on state directly or via vehicle controller 30 before the start of charging, and controls relay RY2 to turn to the off state after the end of charging.

Generally, charging is performed with alternating current in cases of normal charging and direct current in cases of rapid charging. When charging is performed with alternating current (for example, single phase 100/200 V), an A/D converter (not shown) inserted between second relay RY2 and battery pack 41 converts alternating-current power into direct-current power. When charging is performed with direct current, charger 4 generates direct-current power by full-wave rectifying the alternating-current power supplied from commercial power utility grid 7 and smoothing it by a filter.

As a rapid charging standard, it is possible to use, for example, CHAdeMO (registered trademark), Chaoji, GB/T, and Combo (Combined Charging System). CHAdeMO 2.0 specifies the maximum output power (specification) to be 1000 V×400 A=400 KW. CHAdeMO 3.0 specifies the maximum output power (specification) to be 1500 V×600 A=900 kW. Chaoji specifies the maximum output power (specification) to be 1500 V×600 A=900 kW. GB/T specifies the maximum output power (specification) to be 750 V×250 A=185 KW. Combo specifies the maximum output power (specification) to be 900 V×400 A=350 KW. CHAdeMo, Chaoji, and GB/T employ CAN (Controller Area Network) as the communication mode. Combo employs PLC (Power Line Communication) as the communication mode.

A charging cable that employs the CAN system contains a communication line in addition to a power line. When electrically-powered vehicle 3 and charger 4 are connected with the charging cable, vehicle controller 30 establishes a communication channel with a controller of charger 4. Note that, with the charging cable that employs the PLC system, communication signals are superimposed and transmitted on the power line.

Vehicle controller 30 establishes a communication channel with battery manager 42 via an in-vehicle network (such as CAN and LIN (Local Interconnect Network)). When the communication standard between vehicle controller 30 and the controller of charger 4 is different from the communication standard between vehicle controller 30 and battery manager 42, vehicle controller 30 serves a gateway function.

Power supply system 40 mounted in electrically-powered vehicle 3 includes battery pack 41 and battery manager 42. Battery pack 41 includes a plurality of cells. FIG. 2 shows an example of a configuration in which a plurality of cells E1 to En are connected in series. It is also possible to employ a configuration in which a plurality of parallel cell blocks, each parallel cell block including a plurality of cells connected in parallel, are connected in series. Examples of the cells that can be used include lithium-ion battery cells, nickel-metal hydride battery cells, and lead-acid cells. Hereinafter, the present description assumes an example that uses lithium-ion iron phosphate (LFP) battery cells (nominal voltage: 3.6-3.7 V). The number of series-connected cells E1 to En or the number of series-connected parallel cell blocks is determined according to the drive voltage of motor 34.

Shunt resistor Rs is connected in series with the plurality of cells E1 to En or the plurality of parallel cell blocks. Shunt resistor Rs functions as a current detecting element. It is also possible to use a Hall element in place of shunt resistor Rs. A plurality of temperature sensors T1 and T2 for detecting the temperature of the plurality of cells E1 to En or the plurality of parallel cell blocks are installed inside battery pack 41. For temperature sensors T1 and T2, it is possible to use, for example, thermistors. The temperature sensors may be provided so that one temperature sensor is provided per 6 to 8 cells or parallel cell blocks.

Battery manager 42 includes voltage measurer 43, temperature measurer 44, current measurer 45 and battery controller 46. Each node of the plurality of cells E1 to En or the plurality of parallel cell blocks that are connected in series is connected to voltage measurer 43 by a plurality of voltage lines. Voltage measurer 43 measures voltages V1 to Vn of respective cells E1 to En or respective parallel cell blocks by measuring the voltage between two adjacent voltage lines. Voltage measurer 43 transmits measured voltages V1 to Vn of respective cells E1 to En or respective parallel cell blocks to battery controller 46.

Because voltage measurer 43 is at a higher voltage relative to battery controller 46, voltage measurer 43 and battery controller 46 are connected by a communication line with them being electrically insulated from each other. Voltage measurer 43 may be composed of ASIC (Application Specific Integrated Circuit) or general-purpose analog front end IC. Voltage measurer 43 includes a multiplexer and an A/D converter. The multiplexer outputs the voltages between two adjacent voltage lines to the A/D converter sequentially in order from the top. The A/D converter converts the analog voltages that are input from the multiplexer into digital values.

Temperature measurer 44 includes a voltage divider resistor and an A/D converter. The A/D converter converts a plurality of analog voltages that are voltage-divided by the plurality of temperature sensors T1 and T2 and a plurality of voltage divider resistors into digital values and outputs the digital values to battery controller 46. Battery controller 46 measures the temperatures of a plurality of measurement points inside battery pack 41 based on the plurality of digital values.

Current measurer 45 includes a differential amplifier and an A/D converter. The differential amplifier amplifies the voltages at both ends of shunt resistor Rs and outputs to the A/D converter. The A/D converter converts the analog voltages that are input from the differential amplifier into digital values and outputs the digital values to battery controller 46. Battery controller 46 measures current I that flows through the plurality of cells E1 to En or the plurality of parallel cell blocks based on the digital values.

When battery controller 46 includes an A/D converter and battery controller 46 is provided with an analog input port, temperature measurer 44 and current measurer 45 may output analog voltages to battery controller 46 and convert the analog voltages into digital values with the A/D converter inside battery controller 46.

Battery controller 46 controls the state of the plurality of cells E1 to En or the plurality of parallel cell blocks based on the voltages, temperatures, and currents of the plurality of cells E1 to En or the plurality of parallel cell blocks that are measured by voltage measurer 43, temperature measurer 44, and current measurer 45. When overvoltage, undervoltage, overcurrent, or anomaly temperature occurs in at least one of the plurality of cells E1 to En or the plurality of parallel cell blocks, battery controller 46 turns off second relay RY2 or protection relay (not shown) inside battery pack 41 to protect the subject cell or the subject parallel cell block.

Battery controller 46 may be composed of a microcontroller and a non-volatile memory (for example, EEPROM (Electrically Erasable Programmable Read-Only Memory) or flash memory). Battery controller 46 estimates respective SOCs of the plurality of cells E1 to En or the plurality of parallel cell blocks.

Battery controller 46 estimates SOC by combining an OCV method and a current integration method. The OCV method is a method of estimating the SOC based on the OCV of each of the cells measured by voltage measurer 43 and the SOC-OCV curve of the cell. The SOC-OCV curve of the cell is prepared in advance based on the characteristic test conducted by the battery manufacturer and is registered inside an internal memory of the microcontroller at the time of shipment.

The current integration method is a method of estimating the SOC based on the OCV of each of the cells at the start of charging and discharging and the integrated value of the current measured by current measurer 45. In the current integration method, measurement errors of current measurer 45 accumulate as the charge-discharge time increases. On the other hand, the OCV method is adversely affected by the measurement error of voltage measurer 43 and the error resulting from polarization voltage. For this reason, it is preferable to use a weighted average of the SOC estimated by the current integration method and the SOC estimated by the OCV method.

Battery controller 46 samples battery data, including voltage, current, temperature, and SOC, of each of cells E1 to En or each parallel cell block periodically (for example, at 10 second intervals) and transmits the data to vehicle controller 30 via an in-vehicle network. Vehicle controller 30 can transmit battery data to data server 6 using wireless communicator 36 while electrically-powered vehicle 3 is travelling. It is also possible that vehicle controller 30 can be started periodically while electrically-powered vehicle 3 is parked to transmit battery data to data server 6 using wireless communicator 36.

It is also possible that vehicle controller 30 may accumulate battery data of electrically-powered vehicle 3 in an internal memory and transmit the battery data accumulated in the memory at once at predetermined timing. For example, vehicle controller 30 transmits the battery data accumulated in the memory at once to operation control terminal device 2 after the closure of the business of a day. Operation control terminal device 2 transmits the battery data of a plurality of electrically-powered vehicles 3 to data server 6 at predetermined timing.

It is also possible that, during charging from charger 4, vehicle controller 30 may transmit the battery data accumulated in the memory at once via a charging cable to charger 4 equipped with a network communication feature. Charger 4 equipped with the network communication feature transmits the received battery data to data server 6. This example is effective for electrically-powered vehicles 3 that are not equipped with a wireless communication feature.

FIG. 3 is a view illustrating an example of the configuration of battery abnormality detection system 1 according to an exemplary embodiment. Battery abnormality detection system 1 includes processor 11, memory storage 12, and communicator 13. Communicator 13 is a communication interface (for example, NIC: Network Interface Card) for wiredly or wirelessly connecting with network 5.

Processor 11 includes data acquirer 111, dV/dQ estimator 112, charged electricity quantity calculator 113, slope calculator 114, determiner 115, and notifier 116. The functions of processor 11 can be implemented by hardware resources alone or combinations of hardware resources and software resources. For the hardware resources, it is possible to use CPU, ROM, RAM, GPU (Graphics Processing Unit), ASIC (Application Specific Integrated Circuit), FPGA (Field Programmable Gate Array), and other LSIs. For the software resources, it is possible to use programs such as operating systems and application software programs. Memory storage 12 includes a non-volatile memory storage medium, such as HDD (Hard Disk Drive) and SSD (Solid State Drive), to store various types of data.

Data acquirer 111 acquires the battery data of specific battery pack 41 mounted in electrically-powered vehicle 3 from data server 6. The battery data are chronological data containing at least voltage data and current data of the respective cells or the respective parallel cell blocks in specific battery pack 41.

Based on the voltage data and the current data of each cell or each parallel cell block in battery pack 41, dV/dQ estimator 112 estimates dV/dQ, which indicates the differential value of the voltage of each cell or each parallel cell block with respect to the capacity. At that time, dV/dQ estimator 112 identifies the constant-current charging period of battery pack 41 based on the current data contained in the chronological data to estimate dV/dQ of each cell or each parallel cell block in the constant-current charging period.

Charged electricity quantity calculator 113 calculates, at every constant-current charging period, the charged electricity quantity for a period from the first appearing peak to the last appearing peak of a plurality of peaks (local maximum values) of dV/dQ of a plurality of cells or a plurality of parallel cell blocks in battery pack 41.

Slope calculator 114 linearly regresses a plurality of charged electricity quantities calculated at every constant-current charging period for each predetermined interval to calculate the slope of the regression line. Determiner 115 determines that a micro-short circuit has occurred in a cell or a parallel cell block that shows the last appearing dV/dQ peak when the slope of the regression line is greater than or equal to a predetermined value.

Notifier 116 sends, when specific battery pack 41 mounted in electrically-powered vehicle 3 contains a cell or a parallel cell block that shows a micro-short circuit, an alert to subject electrically-powered vehicle 3 or operation control terminal device 2 via network 5. A message for prompting inspection, repair, or replacement is added to the alert notification.

Figure 4:
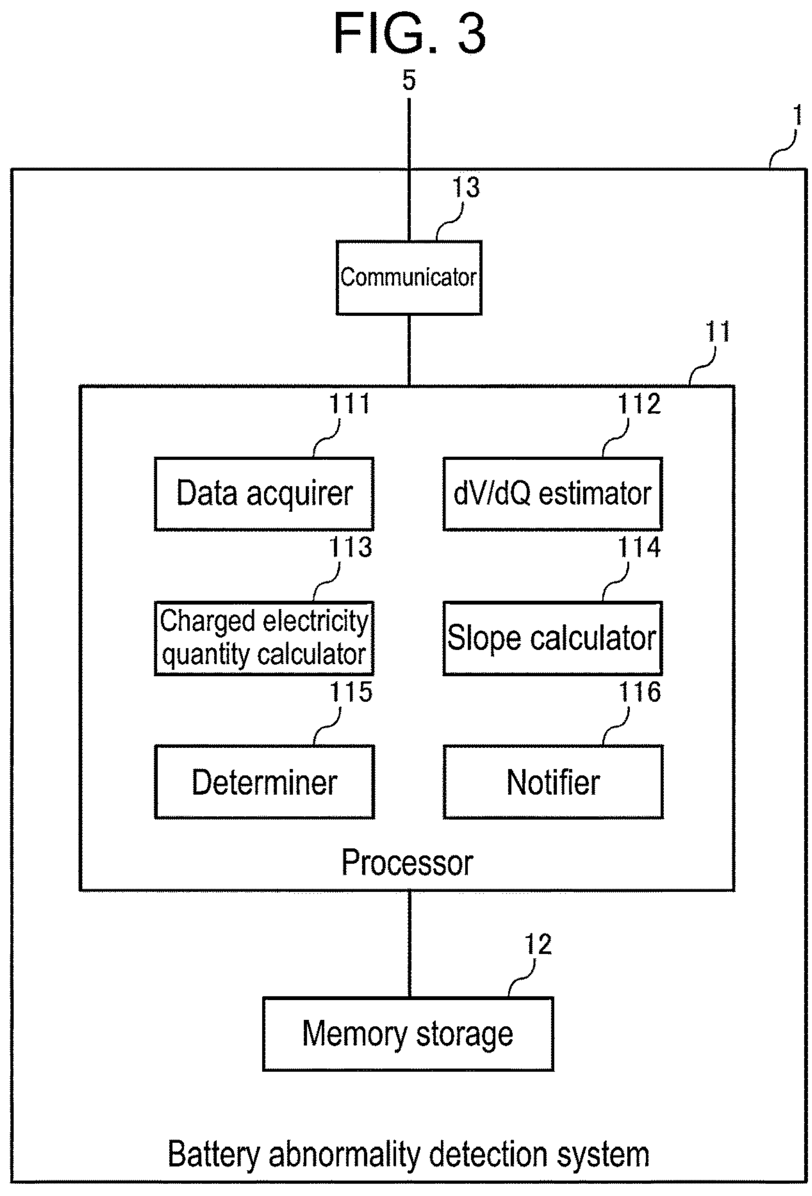
FIG. 4 is a graph illustrating specific examples of SOC-OCV characteristics of a lithium-ion iron phosphate battery and another common lithium-ion battery.

FIG. 4 is a graph illustrating specific examples of SOC-OCV characteristics of a lithium-ion iron phosphate battery and another common lithium-ion battery. A cell with a micro-short circuit is constantly discharging very slightly and therefore shows a relative voltage difference from a normal cell that gradually increases over time. In other words, the voltage of a micro-short circuited cell gradually drops relative to the voltage of a normal cell. For battery pack 41 that employs common lithium-ion batteries, it is easy to detect a micro-short circuited cell from a relative change in voltage of a plurality of cells.

On the other hand, for lithium-ion iron phosphate (LFP) batteries, the SOC-OCV characteristic shows a large plateau region, which means that a change in SOC resulting from a micro-short circuit does not appear as a change in OCV in a large part of the region. Although the OCV abruptly changes near the full charge (SOC=100%), the voltage of only one of the cells that is fully charged first changes abruptly and those of the other cells remain in the flat region.

Figure 5:
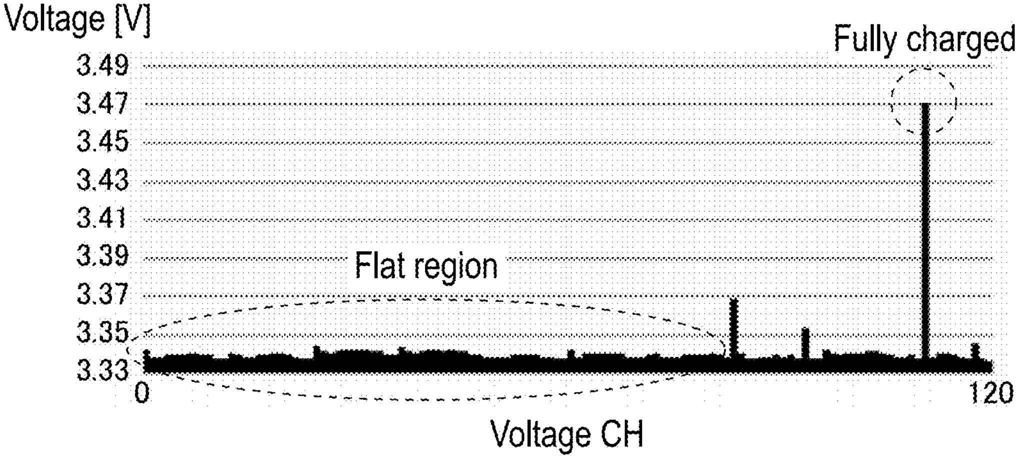
FIG. 5 is a graph illustrating an actually measured example of voltages of cells of a fully charged battery pack that is mounted in an electrically-powered vehicle, which contains 120 series-connected lithium-ion iron phosphate batteries.

FIG. 5 is a graph illustrating an actually measured example of voltages of cells of fully charged battery pack 41 that is mounted in electrically-powered vehicle 3, which contains 120 series-connected lithium-ion iron phosphate batteries. Even when battery pack 41 is in a fully charged state, only one cell has reached the fully charged voltage and many cells remain to be at a voltage in the flat region. Thus, for lithium-ion iron phosphate batteries, it is difficult to detect a micro-short circuited cell from raw voltage data of a plurality of cells. As illustrated in FIG. 4, lithium-ion iron phosphate (LFP) batteries generally shows an increase in OCV approximately at 65% SOC due to the phase transition of the carbon material used for the negative electrode. The present exemplary embodiment detects a micro-short circuited cell based on the difference in time at which the voltage of each of the cells pass through a region corresponds to the just-mentioned phase transition during constant-current charging.

The denominator of dV/dQ during constant-current charging can be substituted by time. Therefore, dV/dQ estimator 112 is able to estimate dV/dQ of each of the cells during constant-current charging from the voltage increase of each of the cells for a predetermined time (dV/dT=dV/dQ).

Figure 6:
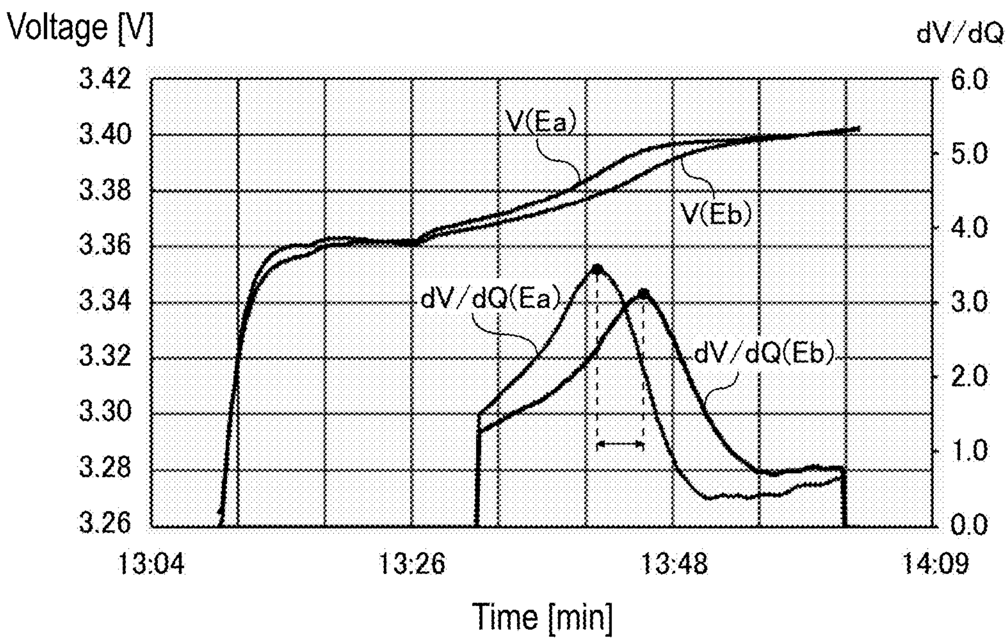
FIG. 6 is a graph illustrating a specific example of change in voltage and dV/dQ of, among a plurality of cells contained in the battery pack, a first cell that passes through a region corresponds to the phase transition first and a second cell that passes through the region last during constant-current charging.

FIG. 6 is a graph illustrating a specific example of change in voltage and change in dV/dQ of, among a plurality of cells contained in battery pack 41, first cell (Ea) that passes through a region corresponds to the phase transition first and second cell (Eb) that passes through the region last. For clarity in illustration of the graph, the voltages and dV/dQ for the cells other than first cell (Ea) and second cell (Eb) are omitted in FIG. 6.

The dV/dQ of each of the cells becomes approximately 0 in the region in which the SOC-OCV characteristic is flat, but shows a higher value for a region in which the SOC-OCV characteristic is steeper. Charged electricity quantity calculator 113 calculates, at every constant-current charging period, the charged electricity quantity [Ah] for a period from the time at which the dV/dQ peak of first cell (Ea) appears to the time at which the dV/dQ peak of second cell (Eb) appears. Charged electricity quantity calculator 113 is able to calculate the charged electricity quantity [Ah] between the peaks by integrating the current data between the peaks.

It is also possible that charged electricity quantity calculator 113 may calculate the charged electricity quantity for a period from the mean value or the median value of the times at which a plurality of dV/dQ peaks of a plurality of cells contained in battery pack 41 appear to the time at which the last dV/dQ peak appears. It is also possible that the data of the last appearing dV/dQ peak may be omitted from the basic data of the mean value of the plurality of dV/dQ peaks. Slope calculator 114 plots the charged electricity quantities between the peaks at every constant-current charging period chronologically.

Figure 7A:
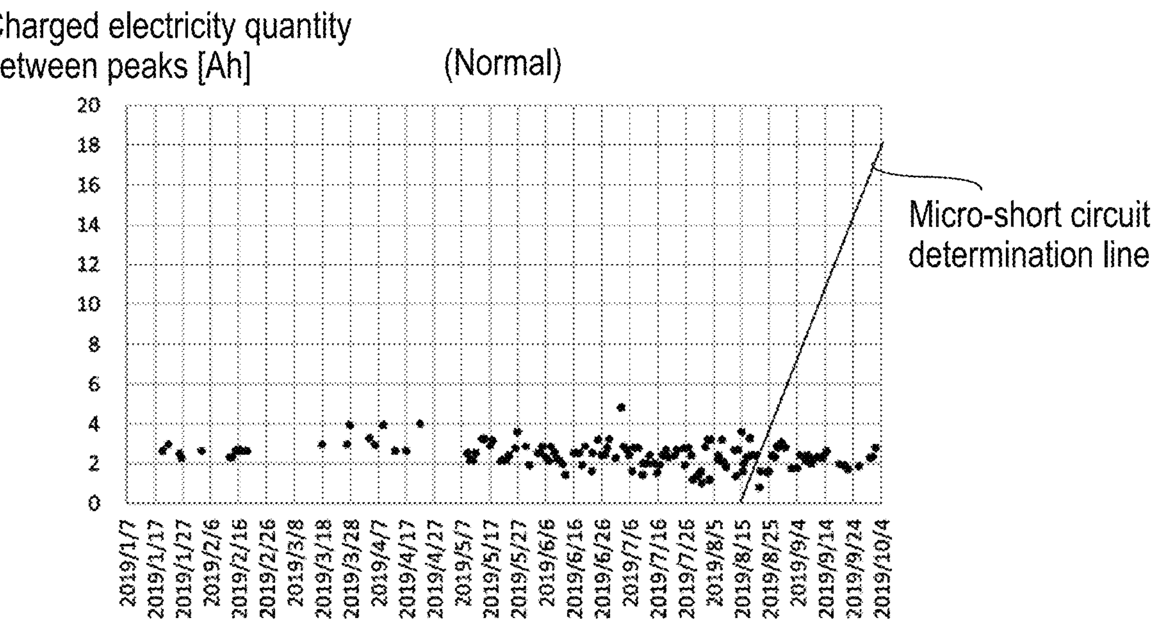
FIG. 7A is a plot of quantities of charged electricity between peaks for a battery pack mounted in an electrically-powered vehicle.
Figure 7B:
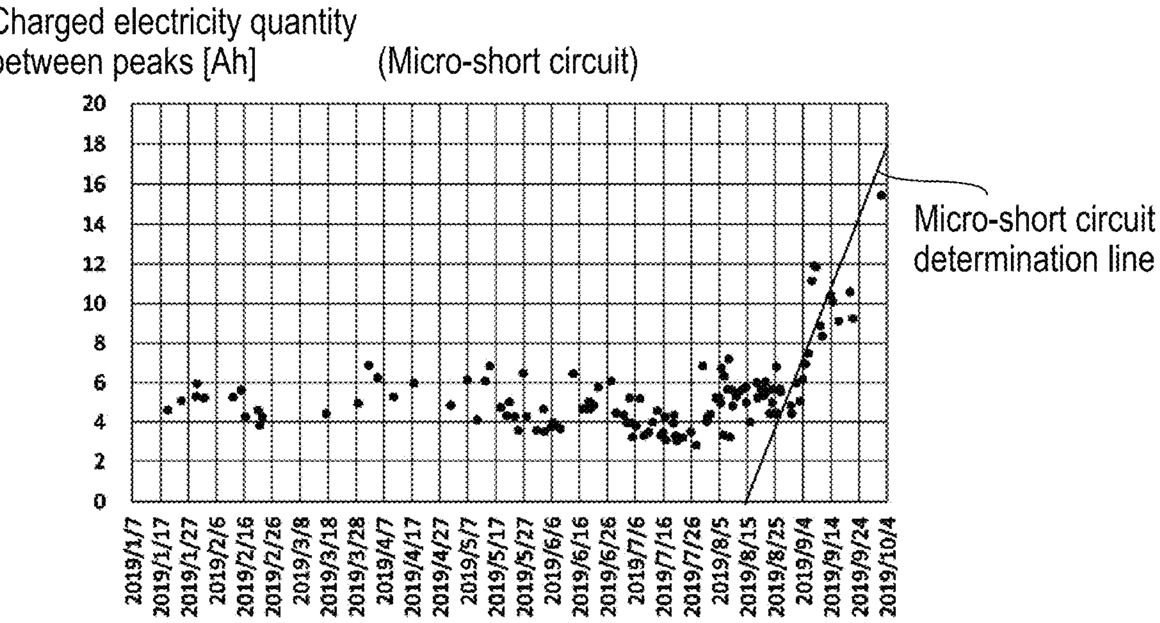
FIG. 7B is another plot of quantities of charged electricity between peaks for the battery pack mounted in the electrically-powered vehicle.

FIGS. 7A and 7B show plots of charged electricity quantities between peaks for battery pack 41 mounted in electrically-powered vehicle 3. FIG. 7A is a plot of charged electricity quantities between peaks for battery pack 41 that does not contain a micro-short circuited cell, and FIG. 7B is a plot of charged electricity quantities between peaks for battery pack 41 that contains a micro-short circuited cell.

The micro-short circuit determination line shown in each of FIGS. 7A and 7B is a determination line that is obtained by linearly regressing (linearly approximating) the charged electricity quantities between a plurality of peaks of battery pack 41 that contains a micro-short circuited cell with a predetermined resistance value.

Slope calculator 114 linearly regresses charged electricity quantities between peaks that are plotted chronologically for every predetermined interval (including the charged electricity quantities between an X number of peaks) to generate a regression line of the charged electricity quantities between the peaks. The number X of sample data of charged electricity quantities between the peaks that constitute a predetermined interval is determined based on the knowledge of the designer that is obtained from the results of experiments or simulations. Slope calculator 114 calculates the slope of the generated regression line of the charged electricity quantities between the peaks.

Determiner 115 compares the slope of the generated regression line of the charged electricity quantities between the peaks against a predetermined value. The predetermined value may be, for example, the slope of the micro-short circuit determination line. The slope of the micro-short circuit determination line is dependent on the allowable lower limit value of cell internal micro-short circuit. When the allowable lower limit value is set higher, the slope of the micro-short circuit determination line becomes a flatter angle. When the allowable lower limit value is set lower, the slope of the micro-short circuit determination line becomes a steeper angle. Determiner 115 determines that a micro-short circuit has occurred in a cell that last passes through the region corresponds to a phase transition when the slope of the generated regression line of the charged electricity quantities between the peaks is greater than or equal to a predetermined value.

Figure 8:
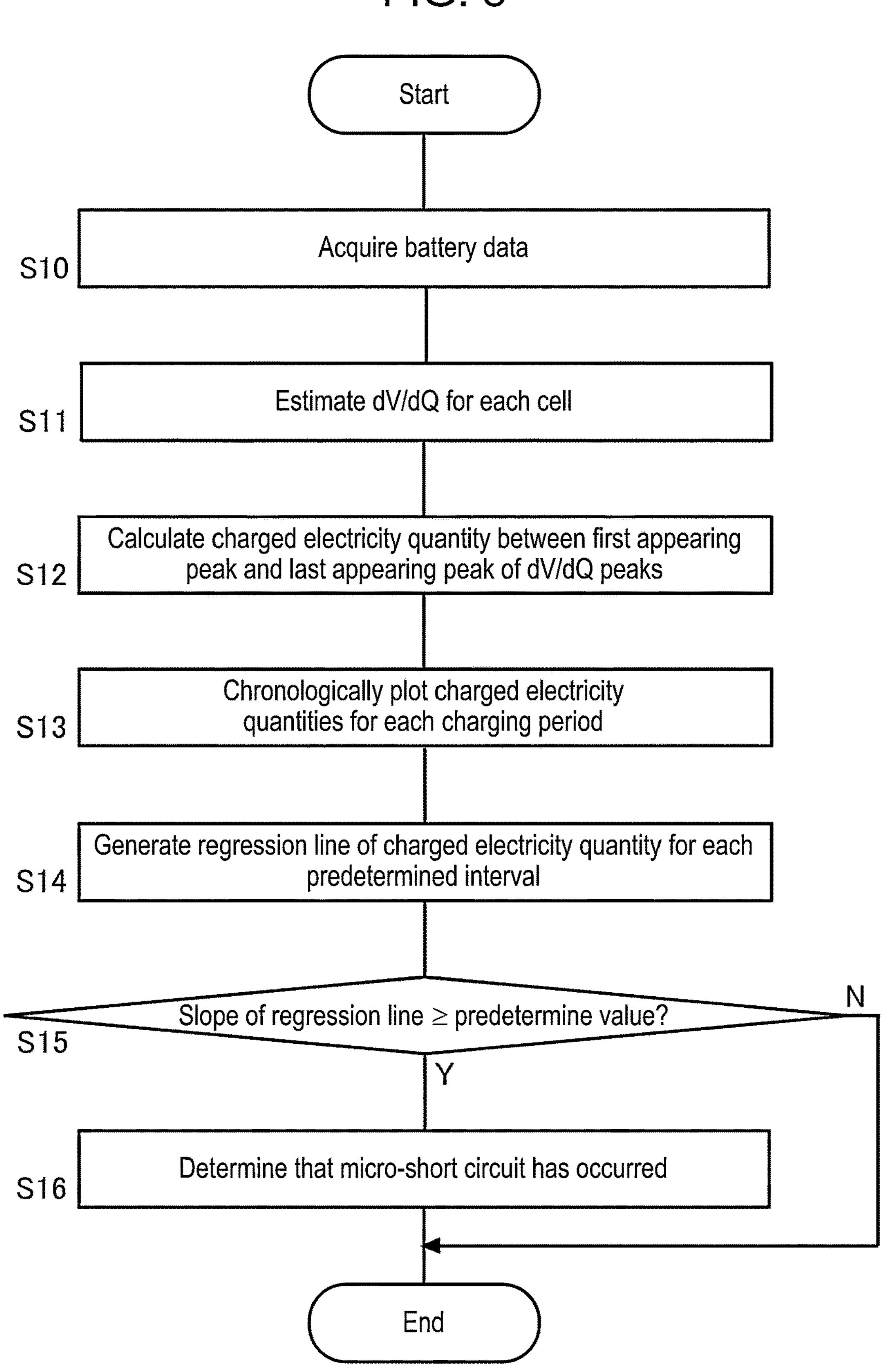
FIG. 8 is a flowchart illustrating the flow of a micro-short circuit detection process performed by the battery abnormality detection system according to an exemplary embodiment.

FIG. 8 is a flowchart illustrating the flow of a micro-short circuit detection process performed by battery abnormality detection system 1 according to an exemplary embodiment. Data acquirer 111 acquires the battery data of specific battery pack 41 mounted in electrically-powered vehicle 3 from data server 6 (S10). Then, dV/dQ estimator 112 estimates dV/dQ of each of the cells contained in battery pack 41 (S11). Charged electricity quantity calculator 113 calculates, at every constant-current charging period, the charged electricity quantity for a period from the first appearing peak to the last appearing peak of a plurality of dV/dQ peaks of a plurality of cells contained in battery pack 41 (S12).

Slope calculator 114 chronologically plots the charged electricity quantities between the peaks calculated at every constant-current charging period (S13). Slope calculator 114 linearly regresses the charged electricity quantities that are plotted chronologically for each predetermined interval to generate a regression line of the charged electricity quantities (S14). Determiner 115 compares the slope of the generated regression line of the charged electricity quantities against a predetermined value (S15). If the slope of the regression line is greater than or equal to the predetermined value (Y in S15), determiner 115 determines that a micro-short circuit has occurred in battery pack 41 (S16). If the slope of the regression line is less than the predetermined value (N in S15), determiner 115 determines that no micro-short circuit has occurred in battery pack 41.

In the foregoing description with reference to FIGS. 5 to 8, battery pack 41 including a plurality of cells connected in series is assumed. However, it is also possible that a micro-short circuit in battery pack 41 including a plurality of parallel cell blocks that are connected in series may be determined with a similar algorithm.

As described above, the present exemplary embodiment detects a micro-short circuit based on changes of charged electricity quantities between the peaks by detecting the peaks of changes in voltage data, not based on raw voltage data. This enables accurate detection of a micro-short circuit in a battery that shows a SOC-OCV characteristic with a large plateau region, such as a lithium-ion iron phosphate (LFP) battery.

Moreover, in order to detect a micro-short circuit, the user is not required to use electrically-powered vehicle 3 in a special manner, such as leaving electrically-powered vehicle 3 at a specific SOC for a long period of time, but the user is allowed to merely use electrically-powered vehicle 3 in a usual manner. Furthermore, it is possible to detect a micro-short circuit when the SOC of battery pack 41 passes through approximately 65% during charging, so it is possible to detect a micro-short even if the rapid charging by charger 4 automatically stops at 80% SOC. In cases where electrically-powered vehicle 3 is a commercial vehicle, it is highly likely that the charging passing through approximately 65% SOC is performed at least one time a day, so a sufficient number of samples can be obtained.

In addition, because the charged electricity quantities between dV/dQ peaks are plotted, it is possible to determine whether or not a micro-short circuit has occurred without relying on absolute voltage measurement values. Therefore, it is possible to reduce adverse effects resulting from temperature variations (internal resistance variations) between the cells or the parallel cell blocks, variation in wiring resistance that affects the voltage measurement value of some of the cells or the parallel cell blocks, differences in charging rate, and the like.

Hereinabove, the present disclosure has been described with reference to exemplary embodiments. It should be understood that the exemplary embodiments are merely illustrative examples. A person skilled in the art will understand that various changes and modifications of elements and combinations of processes are possible herein, and such changes and modifications are also within the scope of the present disclosure.

The above-described exemplary embodiments have described an example in which a dV/dQ peak occurring at approximately 65% SOC is employed as a characteristic point and the maximum variation between characteristic points is measured with charged electricity quantity. In this regard, it is also possible to use a point at which a slope changes to a plateau, which occurs at approximately 25-30% SOC, as the characteristic point of dV/dQ. In this case, charged electricity quantity calculator 113 detects, as the characteristic point, the time at which dV/dQ has dropped to a set value (for example, 0 or (0+a)) after an increase of dV/dQ. The subsequent processes are the same as those in the case where the dV/dQ peak occurring at approximately 65% SOC is used as the characteristic point.

In the case where battery data include SOC data, it is also possible that dV/dQ estimator 112 may estimate dV/dQ of each cell or each parallel cell block when battery pack 41 is in a constant-current charging period and also the SOC of battery pack 41 is within a predetermined range. When the dV/dQ peak occurring at approximately 65% SOC is employed as the characteristic point, the predetermined range may be set to be, for example, a range of 55-75% SOC or a range of 45-85% SOC. When the point at which a slope changes to a plateau, which occurs at approximately 25-30% SOC, is used as the characteristic point, the predetermined range may be set to be a range of 15-35% SOC, for example.

The above-described exemplary embodiments have described an example in which the maximum variation between characteristic points is measured with charged electricity quantity. In this respect, the maximum variation between characteristic points may be measured in terms of period in a simplified manner. In this case, determiner 115 determines that a micro-short circuit has occurred in battery pack 41 when the rate of increase of the maximum variation period between characteristic points reaches greater than or equal to a predetermined value.

The foregoing exemplary embodiments have described examples of detecting a micro-short circuit in a cell or a parallel cell block within battery pack 41 mounted in electrically-powered vehicle 3 using battery abnormality detection system 1 connected to network 5. In this respect, battery abnormality detection system 1 may also be built into battery controller 46. Alternatively, battery abnormality detection system 1 may also be built into charger 4.

Battery abnormality detection system 1 according to the present disclosure is not limited for use in detecting a micro-short circuit inside battery pack 41 mounted in electrically-powered vehicle 3. It is also applicable to the purpose of detecting a micro-short circuit in battery packs mounted in, for example, electrically-powered watercrafts, multicopters (drones), electric motorbikes, electric bicycles, stationary electricity storage systems, smartphones, tablet computers, notebook computers, and the like.

It should be noted that the exemplary embodiments may be specified by the following items.

[Item 1] A battery abnormality detection system (1) including:

a data acquirer (111) acquiring voltage data and current data of a plurality of cells (E1 to En) in a battery pack (41) including the plurality of cells (E1 to En) connected in series, or voltage data and current data of a plurality of parallel cell blocks in a battery pack (41) including the plurality of parallel cell blocks each including a plurality of cells connected in parallel; a dV/dQ estimator (112) estimating dV/dQ indicating a differential value of a voltage with respect to a capacity of each of the cells (E1 to En) or each of the parallel cell blocks based on the voltage data and the current data of the each of the cells (E1 to En) or the each of the parallel cell blocks; and a determiner (115) determining whether or not a micro-short circuit has occurred in the battery pack (41) based on a change in variation of characteristic points of dV/dQ between the plurality of cells (E1 to En) or the plurality of parallel cell blocks.

This enables accurate detection of a micro-short circuit in a battery that shows a SOC-OCV characteristic with a large plateau region.

[Item 2] The battery abnormality detection system (1) according to item 1, wherein: the dV/dQ estimator (112) estimates dV/dQ of the cells (E1 to En) or the parallel cell blocks for a constant-current charging period of the battery pack (41);

the battery abnormality detection system (1) further includes a charged electricity quantity calculator (113) calculating, at every constant-current charging period, a charged electricity quantity for a period from a first appearing peak to a last appearing peak of a plurality of peaks of dV/dQ of the plurality of cells (E1 to En) or the plurality of parallel cell blocks; and the determiner (115) determines whether or not a micro-short circuit has occurred in the battery pack (41) based on a change in the charged electricity quantity.

This reduces adverse effects resulting from internal conditions or external conditions of the cells by measuring a variation of dV/dQ peaks by the charged electricity quantity between the peaks, allowing highly accurate determination of a micro-short circuit.

[Item 3] The battery abnormality detection system (1) according to item 1, wherein: the dV/dQ estimator (112) estimates dV/dQ of each of the cells (E1 to En) or each of the parallel cell blocks for a constant-current charging period of the battery pack (41);

the battery abnormality detection system (1) further includes a charged electricity quantity calculator (113) calculating, at every constant-current charging period, a charged electricity quantity for a period from a mean value or a median value of a plurality of peaks of dV/dQ of the plurality of cells (E1 to En) or the plurality of parallel cell blocks to a last appearing peak of the plurality of peaks of dV/dQ; and the determiner (115) determines whether or not a micro-short circuit has occurred in the battery pack (41) based on a change in the charged electricity quantity.

This reduces adverse effects resulting from internal conditions or external conditions of the cells by measuring a variation of dV/dQ peaks by the charged electricity quantity between the peaks, allowing highly accurate determination of a micro-short circuit. Moreover, it is possible to reduce adverse effects resulting from the noise contained in the dV/dQ values.

[Item 4] The battery abnormality detection system (1) according to item 2 or 3, further including:

a slope calculator (114) calculating a slope of a regression line obtained by linearly regressing a plurality of charged electricity quantities calculated for the every constant-current charging period; and wherein the determiner (115) determines that a micro-short circuit has occurred in one of the cells (Eb) or one of the parallel cell blocks showing the last appearing peak of dV/dQ when the slope of the regression line is greater than or equal to a predetermined value.

This enables accurate detection of a micro-short circuit that is lower than an allowable micro-short circuit resistance value.

[Item 5] The battery abnormality detection system (1) according to any one of items 1 through 4, wherein each of the cells (E1 to En) is a lithium-ion iron phosphate (LFP) battery.

This enables accurate detection of a micro-short circuit in a lithium-ion iron phosphate (LFP) battery that shows a SOC-OCV characteristic with a large plateau region.

[Item 6] A battery abnormality detection method including:

acquiring voltage data and current data of a plurality of cells (E1 to En) of a battery pack (41) including the plurality of cells (E1 to En) connected in series, or voltage data and current data of each of a plurality of parallel cell blocks of a battery pack (41) including the plurality of parallel cell blocks each including a plurality of cells connected in parallel;

estimating dV/dQ indicating a differential value of a voltage with respect to a capacity of each of the cells (E1 to En) or each of the parallel cell blocks based on the voltage data and the current data of the each of the cells (E1 to En) or the each of the parallel cell blocks; and determining whether or not a micro-short circuit has occurred in the battery pack (41) based on a change in variation of characteristic points of dV/dQ between the plurality of cells (E1 to En) or the plurality of parallel cell blocks.

This enables accurate detection of a micro-short circuit in a battery that shows a SOC-OCV characteristic with a large plateau region.

[Item 7] A battery abnormality detection program causing a computer to execute:

a process of acquiring voltage data and current data of a plurality of cells (E1 to En) of a battery pack (41) including the plurality of cells (E1 to En) connected in series, or voltage data and current data of each of a plurality of parallel cell blocks of a battery pack (41) including the plurality of parallel cell blocks each including a plurality of cells connected in parallel;

a process of estimating dV/dQ indicating a differential value of a voltage with respect to a capacity of each of the cells (E1 to En) or each of the parallel cell blocks based on the voltage data and the current data of the each of the cells (E1 to En) or the each of the parallel cell blocks; and a process of determining whether or not a micro-short circuit has occurred in the battery pack (41) based on a change in variation of characteristic points of dV/dQ between the plurality of cells (E1 to En) or the plurality of parallel cell blocks.

This enables accurate detection of a micro-short circuit in a battery that shows a SOC-OCV characteristic with a large plateau region.

REFERENCE MARKS IN THE DRAWINGS

1 battery abnormality detection system
2 operation control terminal device
3 electrically-powered vehicle
4 charger
5 network
6 data server
7 commercial power utility grid
11 processor
111 data acquirer
112 dV/dQ estimator
113 charged electricity quantity calculator
114 slope calculator
115 determiner
116 notifier
12 memory storage
30 vehicle controller
34 motor
35 inverter
36 wireless communicator
**36*a*** antenna
40 power supply system
41 battery pack
42 battery manager
43 voltage measurer
44 temperature measurer
45 current measurer
46 battery controller
E1-En cell
RY1-RY2 relay
T1-T2 temperature sensor
Rs shunt resistor

The invention claimed is:

1. A battery abnormality detection system comprising:

one or more memories; and at least one processor each coupled to at least one of the one or more memories and configured to perform operations comprising:

acquiring voltage data and current data of each of a plurality of cells in a battery pack including the plurality of cells connected in series, or voltage data and current data of each of a plurality of parallel cell blocks connected in series in a battery pack including the plurality of parallel cell blocks each including a plurality of cells connected in parallel;

estimating dV/dQ indicating a differential value of a voltage with respect to a capacity of the each of the plurality of cells or the each of the plurality of parallel cell blocks for a constant-current charging period of the battery pack, based on the voltage data and the current data of the each of the plurality of cells or the each of the plurality of parallel cell blocks;

calculating, at every constant-current charging period, a charged electricity quantity for a period from a first appearing peak to a last appearing peak of a plurality of peaks of dV/dQ of the plurality of cells or the plurality of parallel cell blocks, based on voltage transitions and dV/dQ transitions of the each of the plurality of cells or the each of the plurality of parallel cell blocks during the constant-current charging; and determining whether or not a micro-short circuit has occurred in the battery pack based on a change in the charged electricity quantity.

2. The battery abnormality detection system according to claim 1, wherein:

the operations further comprise:

calculating a slope of a regression line obtained by linearly regressing a plurality of charged electricity quantities calculated for the every constant-current charging period, and the determining comprises determining that a micro-short circuit has occurred in one of the plurality of cells or one of the plurality of parallel cell blocks showing the last appearing peak of dV/dQ when the slope of the regression line is greater than or equal to a predetermined value.

3. The battery abnormality detection system according to claim 1, wherein each of the plurality of cells is a lithium-ion iron phosphate battery.

4. A battery abnormality detection method comprising:

acquiring voltage data and current data of each of a plurality of cells in a battery pack including the plurality of cells connected in series, or voltage data and current data of each of a plurality of parallel cell blocks connected in series in a battery pack including the plurality of parallel cell blocks each including a plurality of cells connected in parallel;

estimating dV/dQ indicating a differential value of a voltage with respect to a capacity of the each of the plurality of cells or the each of the plurality of parallel cell blocks for a constant-current charging period of the battery pack, based on the voltage data and the current data of the each of the plurality of cells or the each of the plurality of parallel cell blocks;

calculating, at every constant-current charging period, a charged electricity quantity for a period from a first appearing peak to a last appearing peak of a plurality of peaks of dV/dQ of the plurality of cells or the plurality of parallel cell blocks, based on voltage transitions and dV/dQ transitions of the each of the plurality of cells or the each of the plurality of parallel cell blocks during the constant-current charging; and determining whether or not a micro-short circuit has occurred in the battery pack based on a change in the charged electricity quantity.

5. A non-transitory machine-readable recording medium that stores a battery abnormality detection program causing a computer to execute:

a process of acquiring voltage data and current data of each of a plurality of cells in a battery pack including the plurality of cells connected in series, or voltage data and current data of each of a plurality of parallel cell blocks connected in series in a battery pack including the plurality of parallel cell blocks each including a plurality of cells connected in parallel;

a process of estimating dV/dQ indicating a differential value of a voltage with respect to a capacity of each of the plurality of cells or each of the plurality of parallel cell blocks for a constant-current charging period of the battery pack, based on the voltage data and the current data of the each of the plurality of cells or the each of the plurality of parallel cell blocks;

a process of calculating, at every constant-current charging period, a charged electricity quantity for a period from a first appearing peak to a last appearing peak of a plurality of peaks of dV/dQ of the plurality of cells or the plurality of parallel cell blocks, based on voltage transitions and dV/dQ transitions of the each of the plurality of cells or the each of the plurality of parallel cell blocks during the constant-current charging; and a process of determining whether or not a micro-short circuit has occurred in the battery pack based on a change in the charged electricity quantity.

* * * * *